(12) United States Patent
Kobayashi et al.

(10) Patent No.: US 9,357,633 B2
(45) Date of Patent: May 31, 2016

(54) STRUCTURE, WIRING BOARD, AND METHOD OF MANUFACTURING WIRING BOARD

(75) Inventors: Naoki Kobayashi, Tokyo (JP); Hiroshi Toyao, Tokyo (JP); Noriaki Ando, Tokyo (JP)

(73) Assignee: NEC Corporation, Tokyo (JP)

( * ) Notice: Subject to any disclaimer, the term of this patent is extended or adjusted under 35 U.S.C. 154(b) by 137 days.

(21) Appl. No.: 13/583,168

(22) PCT Filed: Feb. 7, 2011

(86) PCT No.: PCT/JP2011/000665
§ 371 (c)(1),
(2), (4) Date: Sep. 6, 2012

(87) PCT Pub. No.: WO2011/111297
PCT Pub. Date: Sep. 15, 2011

(65) Prior Publication Data
US 2012/0325523 A1    Dec. 27, 2012

(30) Foreign Application Priority Data

Mar. 8, 2010  (JP) ................................ 2010-051078

(51) Int. Cl.
*H05K 1/11* (2006.01)
*H05K 1/00* (2006.01)
(Continued)

(52) U.S. Cl.
CPC ............ *H05K 1/0236* (2013.01); *H01P 1/2005* (2013.01); *H01Q 15/006* (2013.01); *H01Q 15/008* (2013.01); *Y10T 29/49165* (2015.01)

(58) Field of Classification Search
CPC . H05K 1/0236; H01Q 15/008; H01Q 15/006; H01P 1/2005; Y10T 29/49165
USPC ......... 174/255, 266, 250, 256, 262; 343/756, 343/909, 700 MS, 772; 361/792–795; 333/12, 185, 236, 238, 239, 242; 29/852
See application file for complete search history.

(56) References Cited

U.S. PATENT DOCUMENTS

| 6,262,495 B1 | 7/2001 | Yablonovitch et al. |
| 6,380,608 B1 * | 4/2002 | Bentley .......................... 257/531 |

(Continued)

FOREIGN PATENT DOCUMENTS

| CN | 101610636 A | 12/2009 |
| JP | 2006-253929 A | 9/2006 |

(Continued)

OTHER PUBLICATIONS

Office Action mailed Jan. 13, 2014 in related Chinese application No. 201180013159.1 with English-language translation (16 pages).

(Continued)

*Primary Examiner* — Sherman Ng
(74) *Attorney, Agent, or Firm* — Foley & Lardner LLP

(57) ABSTRACT

A structure (100) includes ground conductive bodies (111 and 141) that are formed in an A layer (110) and a D layer (140) that face each other, a connection member (151) that connects between the ground conductive bodies (111 and 141), a conductive part (131) that is formed in a C layer (130) and faces the ground conductive bodies (111 and 141), and an opening (132), through which the connection member (151) passes through, disposed in the conductive part (131), and a conductive element (121) that is formed in a B layer (120), faces the conductive part (131), and is electrically connected to the connection member (151) that passes through an opening (132) disposed in the conductive part (131).

12 Claims, 21 Drawing Sheets

(51) Int. Cl.
*H05K 1/03* (2006.01)
*H01K 3/10* (2006.01)
*H05K 1/02* (2006.01)
*H01Q 15/00* (2006.01)
*H01P 1/20* (2006.01)

(56) References Cited

U.S. PATENT DOCUMENTS

| | | | |
|---|---|---|---|
| 6,476,771 B1* | 11/2002 | McKinzie, III | 343/756 |
| 6,970,057 B2* | 11/2005 | Lin et al. | 333/177 |
| 7,423,608 B2* | 9/2008 | Dunn et al. | 343/909 |
| 7,737,899 B1* | 6/2010 | McKinzie, III | 343/756 |
| 8,242,970 B2 | 8/2012 | Fukui et al. | |
| 2005/0134522 A1 | 6/2005 | Waltho | |
| 2006/0250198 A1* | 11/2006 | Meltzer et al. | 333/185 |
| 2007/0285188 A1* | 12/2007 | Song et al. | 333/12 |
| 2008/0266018 A1* | 10/2008 | Han et al. | 333/12 |
| 2009/0015354 A1* | 1/2009 | Kim et al. | 333/247 |
| 2009/0315648 A1* | 12/2009 | Toyao | 333/238 |
| 2010/0053013 A1* | 3/2010 | Konishi et al. | 343/772 |
| 2010/0108373 A1* | 5/2010 | Park | 174/376 |
| 2010/0252319 A1* | 10/2010 | Cho et al. | 174/377 |

FOREIGN PATENT DOCUMENTS

| | | |
|---|---|---|
| JP | 2008-147763 A | 6/2008 |
| JP | 2008-277755 A | 11/2008 |
| JP | 2009-021594 A | 1/2009 |
| JP | 2009-105575 A | 5/2009 |
| JP | 2010-10183 A | 1/2010 |
| JP | 2010-16554 A | 1/2010 |
| JP | 2010-50628 A | 3/2010 |
| WO | WO 2008/054324 A1 | 5/2008 |
| WO | WO 2009/145237 A1 | 12/2009 |

OTHER PUBLICATIONS

Office action mailed Dec. 9, 2014 in related Japanese application No. 2012-504292 with partial English-language translation (7 pgs.).
Office action mailed Dec. 18, 2014 in related Chinese Application No. 201180013159.1 with English-language translation (23 pgs.).

* cited by examiner

FIG. 15
(A)
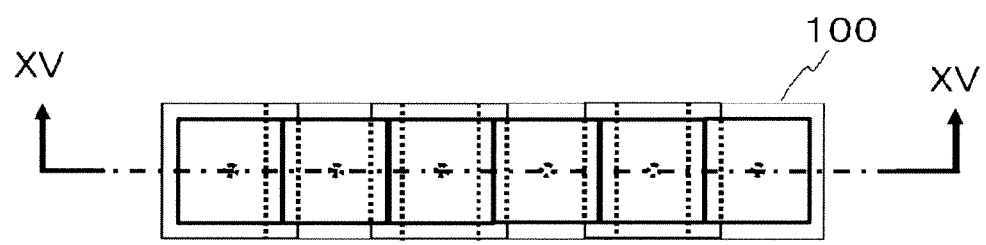
(B)
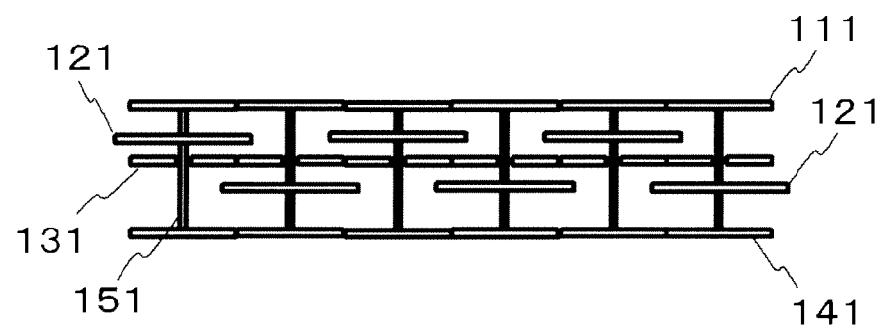

FIG. 17
(A)
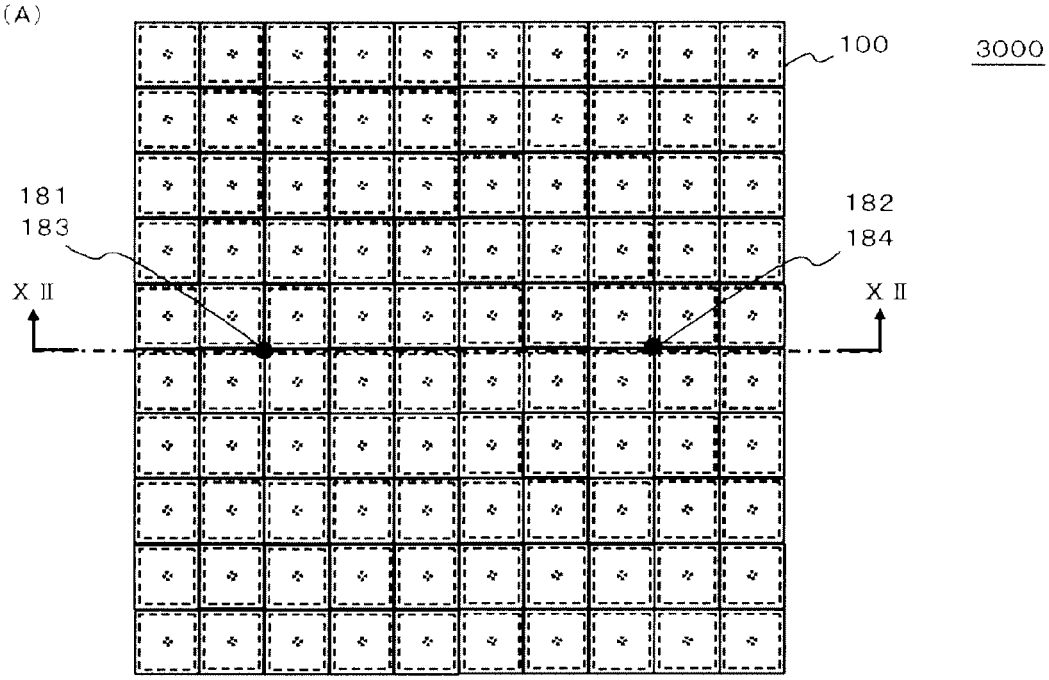
(B)
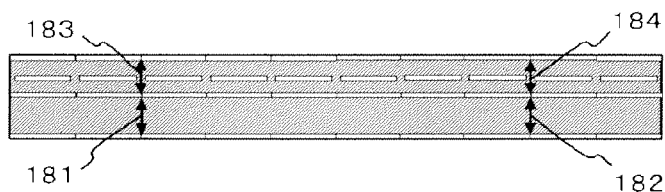

FIG. 20
(A)
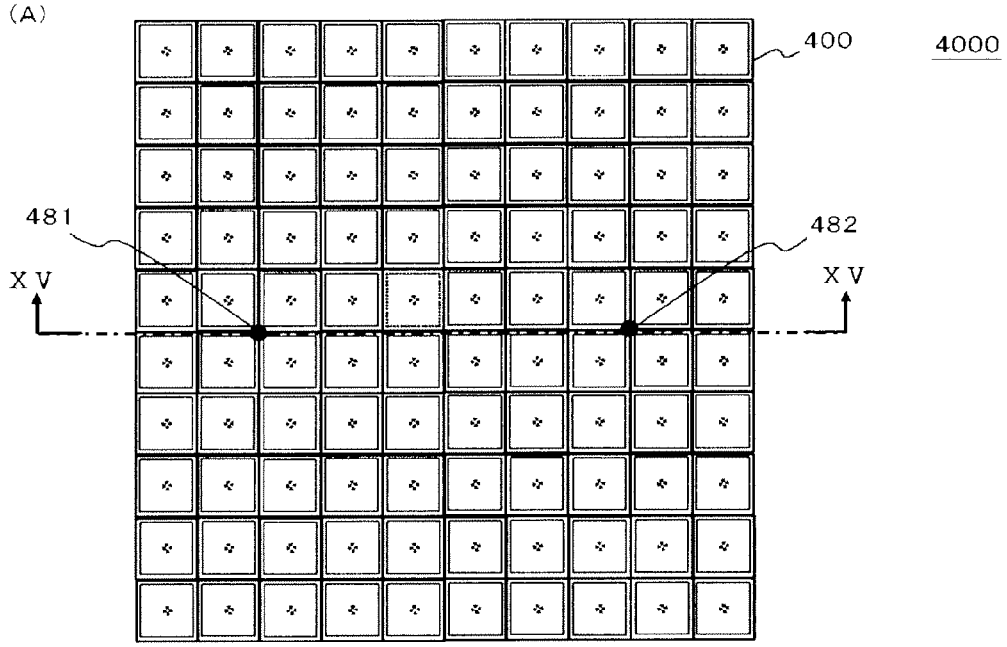
(B)
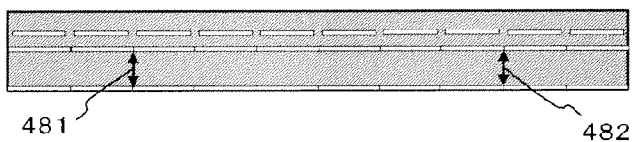

STRUCTURE, WIRING BOARD, AND METHOD OF MANUFACTURING WIRING BOARD

This application is the National Phase of PCT/JP2011/000665, filed Feb. 7, 2011, which claims priority to Japanese Application No. 2010-051078, filed Mar. 8, 2010, the disclosures of which are hereby incorporated by reference in their entirety.

TECHNICAL FIELD

The present invention relates to a structure, a wiring board, and a method of manufacturing a wiring board.

BACKGROUND ART

In recent years, it has been disclosed that the electric wave characteristics of electromagnetic waves can be controlled by periodically arranging a conductive body pattern having a specific structure (hereinafter, referred to as a meta-material). More specifically, a meta-material that is configured so as to suppress the propagation of the electromagnetic waves in a specific frequency band is called an electromagnetic band gap structure (hereinafter, referred to as an EBG structure).

As a technique of such a type, for example, there is a technique described in Patent Document 1 (U.S. Pat. No. 6,262,495 Specification). In FIG. 2 of Patent Document 1, a structure, that is, a so-called EBG structure of a mushroom type is illustrated, in which a plurality of island-shaped conduction elements is arranged on the upper side of a sheet-shaped conduction plane, and each of the island-shaped conduction elements is connected to the conduction plane as a via.

RELATED DOCUMENT

Patent Document

[Patent Document 1] U.S. Pat. No. 6,262,495 Specification

DISCLOSURE OF THE INVENTION

However, the frequency band that can be suppressed by the EBG structure disclosed in Patent Document 1 is relatively high, and the suppression effect in a relatively low frequency band is low.

The present invention is devised in view of the above-described circumstances, and the object thereof is to provide a structure capable of sufficiently suppressing the propagation of electromagnetic waves in both a high frequency band and a low frequency band or a wiring board that has the structure.

According to the present invention, there is provided a structure including: a first conductive body and a second conductive body that are respectively formed in a first layer and a second layer that face each other; a connection member that connects the first conductive body and the second conductive body; a third conductive body that is formed in a third layer that is located in the middle of the first layer and the second layer and faces the first conductive body and the second conductive body; an opening, through which the connection member passes, disposed in the third conductive body; and a fourth conductive body that is located in a fourth layer that is located in the middle of the first layer and the second layer and is different from the third layer, faces the third conductive body, and is electrically connected to the connection member that passes through the opening disposed in the third conductive body.

In addition, according to the present invention, there is provided a wiring board including: a first conductive body and a second conductive body that are respectively formed in a first layer and a second layer that face each other; a connection member that connects the first conductive body and the second conductive body; a third conductive body that is formed in a third layer that is located in the middle of the first layer and the second layer and faces the first conductive body and the second conductive body; an opening, through which the connection member passes, disposed in the third conductive body; a fourth conductive body that is located in a fourth layer that is located in the middle of the first layer and the second layer and is different from the third layer, faces the third conductive body, and is electrically connected to the connection member that passes through the opening disposed in the third conductive body.

Furthermore, according to the present invention, there is provided a method of manufacturing a wiring board including: (a) arranging a first conductive body in a first layer, a second conductive body in a second layer, a third conductive body in a third layer that is located in the middle of the first layer and the second layer, and a fourth conductive body in a fourth layer that is located in the middle of the first layer and the second layer and is different from the third layer, and arranging the first conductive body and the second conductive body to face each other and the third conductive body and the fourth conductive body to face each other; and (b) arranging a through hole that passes through the first conductive body, the second conductive body, the third conductive body, and the fourth conductive body and forming a connection member 151 that is insulated from the third conductive body and is connected to the first conductive body, the second conductive body, and the fourth conductive body inside the through hole.

According to the present invention, a structure capable of sufficiently suppressing the propagation of electromagnetic waves in both a high frequency band and a low frequency band or a wiring board having the structure is provided.

BRIEF DESCRIPTION OF THE DRAWINGS

FIG. 15 is a diagram that illustrates a modified example of the arrangement of the structure described in the first embodiment.

FIG. 17 represents a top view and a cross-sectional view of a wiring board that is used in the simulation.

FIG. 20 represents a top view and a cross-sectional view of a wiring board that is used in the simulation.

DESCRIPTION OF EMBODIMENTS

Figure 1:
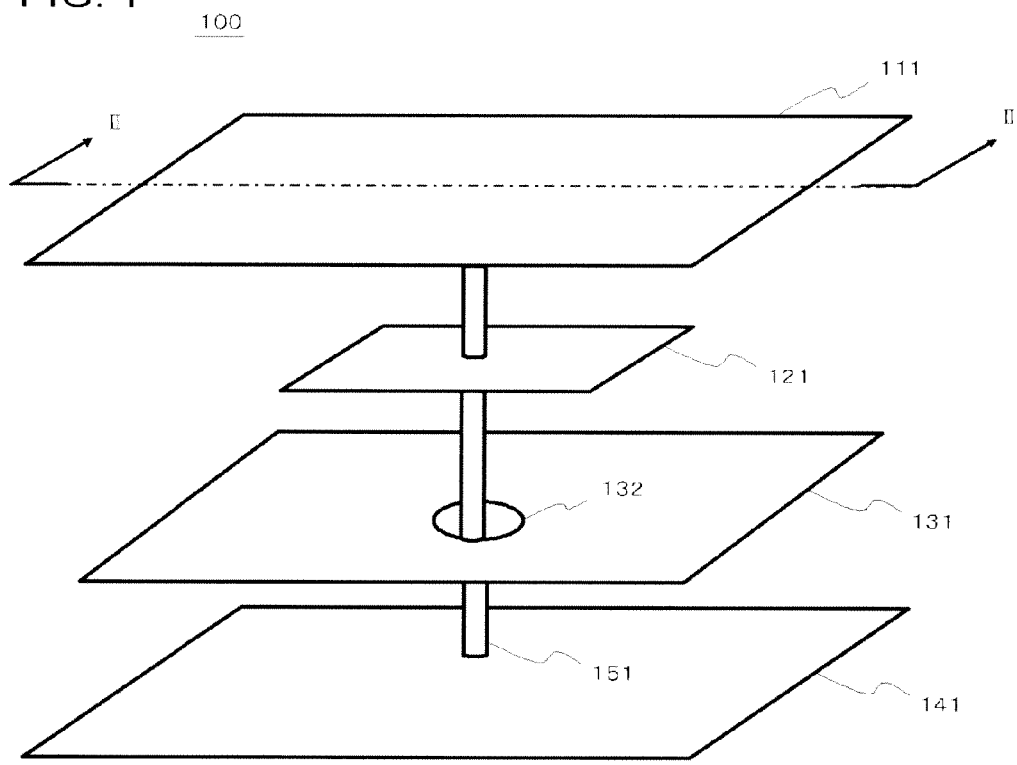
FIG. 1 is a perspective view of a structure according to a first embodiment of the present invention.

Hereinafter, embodiments of the present invention will be described with reference to the drawings. In all the drawings, the same reference numeral is assigned to the same constituent elements, and the description thereof will not be presented as is appropriate.

First Embodiment

FIG. 1 is a perspective view of a structure 100 according to a first embodiment of the present invention. The structure 100 is configured by various constituent elements having conductivity that are formed in an A layer 110 (first layer), a B layer 120 (fourth layer), a C layer 130 (third layer) or a D layer 140 (second layer). In addition, the A layer 110, the B layer 120, the C layer 130, or the D layer 140 is a layer of the wiring board 1000, and the layers face each other.

A ground conductive body 111 (first conductive body) and a ground conductive body 141 (second conductive body) are provided with a reference electric potential through grounding or the like. In addition, a ground conductive body 111 and a ground conductive body 141 are formed in the A layer 110 and the D layer 140 respectively and are connected in an interlayered manner through a connection member 151. Furthermore, the ground conductive body 111 may be formed in the whole face of the A layer 110 or be formed locally therein. Similarly, the ground conductive body 141 may be formed in the whole face of the D layer 140 or be formed locally therein.

A conductive part 131 (third conductive body) is formed in the C layer 130 that is disposed between the A layer 110 and the D layer 140. In addition, the conductive part 131 faces the ground conductive body 111 and the ground conductive body 141. Furthermore, an opening 132 through which the connection member 151 passes is disposed in the conductive part 131, and the conductive part 131 and the connection member 151 are not in contact with each other but are insulated from each other. In addition, the conductive part 131 may be formed in the whole face of the C layer 130 or be formed locally therein. Furthermore, there may be one or a plurality of the openings 132 disposed in the conductive part 131. Furthermore, there may be one or a plurality of the connection members 151 passing through the opening 132. In addition, the area of the opening 132 is smaller than the area of the opposed conductive element 121, and at least a part of the conductive element 121 faces the conductive part 131.

The conductive element 121 (fourth conductive body) is disposed in the B layer 120 that is located in the middle of the A layer 110 and the D layer 140 and is different from the C layer 130. In addition, the conductive element 121 faces the conductive part 131 and is electrically connected to the connection member 151 that passes through the opening 132 disposed in the conductive part 131. Furthermore, although the connection member 151 is illustrated so as to be connected to the center of the conductive element 121 in FIG. 1, the connection member 151 may not be connected to the center thereof.

The connection member 151 may be formed by using a build-up method in which stacking, through-hole processing, and wiring formation are repeated for each layer. In addition, the connection member 151 may be a through via. In a case where the connection member 151 is the through via, the structure 100 is manufactured in the following order. First, (a) the ground conductive body 111 is disposed in the A layer 110, the ground conductive body 141 is disposed in the D layer 140, the conductive part 131 is disposed in the C layer, the conductive element 121 is disposed in the B layer, and the ground conductive body 111, the conductive element 121, the conductive part 131, and the ground conductive body 141 are arranged so as to face each other. Then, (b) a through hole is disposed, which passes through the ground conductive body 111, the conductive element 121, the conductive part 131, and the ground conductive body 141, and a connection member 151 that is insulated from the conductive part 131 inside the through hole and is connected to the ground conductive body 111, the conductive element 121, and the ground conductive body 141 is formed.

It is apparent that, in a case where there is a constituent element not illustrated in the drawing, it is preferable that the constituent element be appropriately arranged in the process of (a). In addition, in the process of (b), as a method of forming the through hole, any applicable method may be used, and, for example, the through hole may be formed by using a drill. Furthermore, in the process of (b), as a method of forming the connection member 151, any applicable method may be used, and, for example, the connection member 151 may be formed by plating the inner face of the through hole.

By manufacturing the connection member 151 as a through via, compared to a case where the connection member 151 is manufactured using the build-up method, the manufacturing process can be shortened, whereby the manufacturing cost can be reduced.

The ground conductive body 111, the conductive element 121, the conductive part 131, and the ground conductive body 141 may be conductive bodies that extend in the directions of planes of the layers in which these are formed, and the shapes may be a plurality of forms. Thus, although all the shapes are illustrated as quadrangles in FIG. 1, the shapes are not limited thereto.

Figure 2:
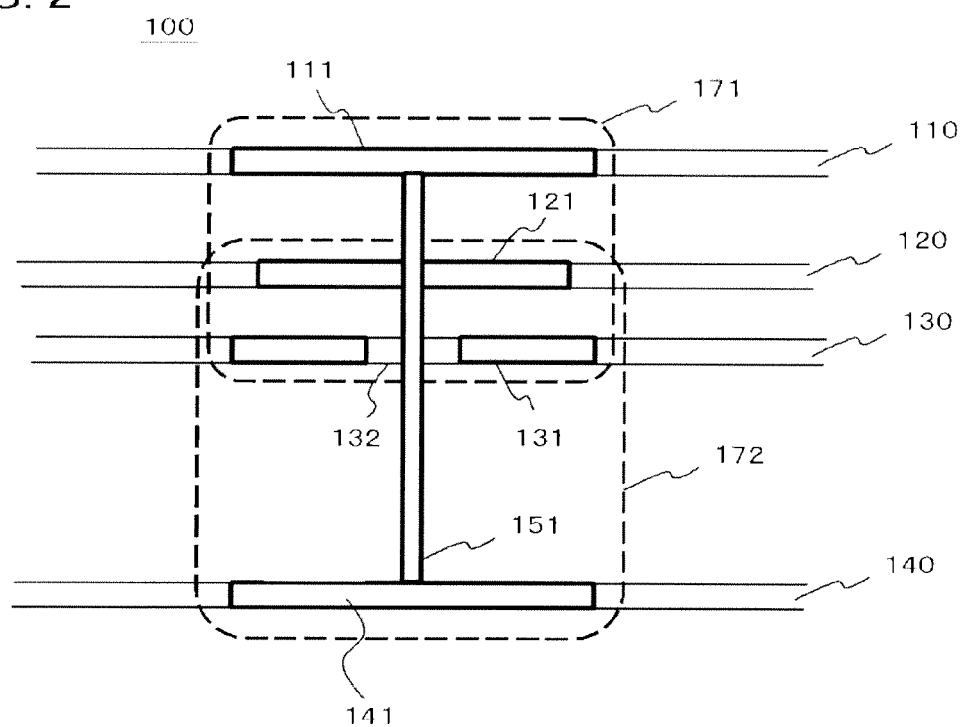
FIG. 2 is a cross-sectional view of the structure illustrated in FIG. 1.

FIG. 2 is a cross-sectional view in the cross-section that is illustrated in FIG. 1. In FIG. 2, spaces surrounded by broken lines form EBG structures and will be referred to as an EBG structure 171 and an EBG structure 172. The EBG structure 171 is configured by the ground conductive body 111 formed in the A layer 110, the connection member 151, the conductive part 131, and the conductive element 121. The EBG structure 172 is configured by the ground conductive body 141 formed in the D layer 140, the connection member 151, the conductive part 131, and the conductive element 121. In other words, the single structure 100 configures the EBG structure 171 and the EBG structure 172, and the conductive element 121 is shared by both the EBG structure 171 and the EBG structure 172. Accordingly, compared to a case where two EBG structures are provided, the structure can be further miniaturized.

Figure 3:
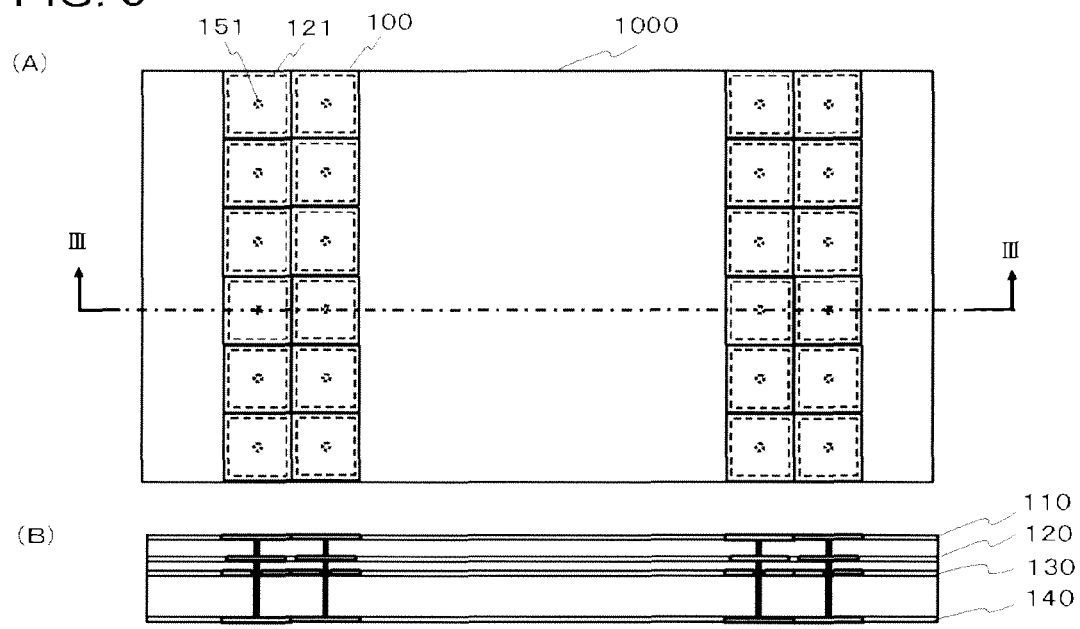
FIG. 3 represents a top view and a cross-sectional view of a wiring board according to the first embodiment.

FIG. 3 represents a top view and a cross-sectional view of the wiring board 1000 according to this embodiment. More specifically, FIG. 3(A) is the top view of the wiring board 1000, and FIG. 3(B) is a cross-sectional view in the cross-section illustrated in FIG. 3(A). In FIG. 3(A), each quadrangle that is denoted by broken lines represents a conductive element 121 in which each one of repeatedly arranged structures 100 is included in the B layer 120. In addition, in FIG. 3(A), each circle that is denoted by broken lines represents the connection member 151 that is included in each one of the repeatedly arranged structures 100.

In the A layer 110, a ground plane that includes a plurality of ground conductive bodies 111 is formed. The ground plane is a so-called beta conductor and is provided with a reference electric potential through grounding or the like. In addition, the ground plane may be single or may be divided into a plurality of parts.

In the D layer 140, a ground plane that includes a plurality of ground conductive bodies 141 is formed. The ground plane is a so-called beta conductor and is provided with a reference electric potential through grounding or the like. In addition, the ground plane may be single or may be divided into a plurality of parts.

In the B layer 120, a plurality of the conductive elements 121 is formed in island shapes while being separated from each other, and each conductive element 121 is connected to the ground plane through the connection member 151. In addition, it is assumed that the conductive elements 121 are insulated from one another.

In the C layer 130, a conductive plane that includes a plurality of conductive parts 131 is formed, and openings 132 through which the connection members 151 connected to the conductive elements 121 facing the conductive parts 131 pass are arranged. The conductive plane is a so-called beta conductor and, for example, may be a power plane for supplying power. In such a case a constant electric potential is given to the conductive plane. In addition, the conductive plane may be single or may be divided into a plurality of parts.

Each one of the A layer 110, the B layer 120, the C layer 130, and the D layer 140 may include a configuration other than the above-described constituent elements, for example, a transmission path that transmits an electrical signal or the like. In addition, the wiring board 1000 may include a layer other than the A layer 110, the B layer 120, the C layer 130, and the D layer 140, and, in the layer, a configuration other than the above-described constituent elements, for example, a transmission path or the like may be included. However, in a case where the transmission path is arranged in an area in which the structures 100 are repeatedly arranged in the wiring board 1000 or near the area, the characteristics of the EBG structure that forms the structure 100 change, and accordingly, it is preferable to avoid such an arrangement.

The wiring board 1000 can suppress the propagation of electromagnetic waves of a specific frequency band in the area in which the structures 100 are repeatedly arranged. In other words, the structure 100 may be arranged so as to surround an element or the like that is desired to be protected from a noise source that generates electromagnetic waves of a specific frequency hand or electromagnetic waves of a specific frequency band, and the arrangement pattern may have a plurality of forms.

Figure 4:
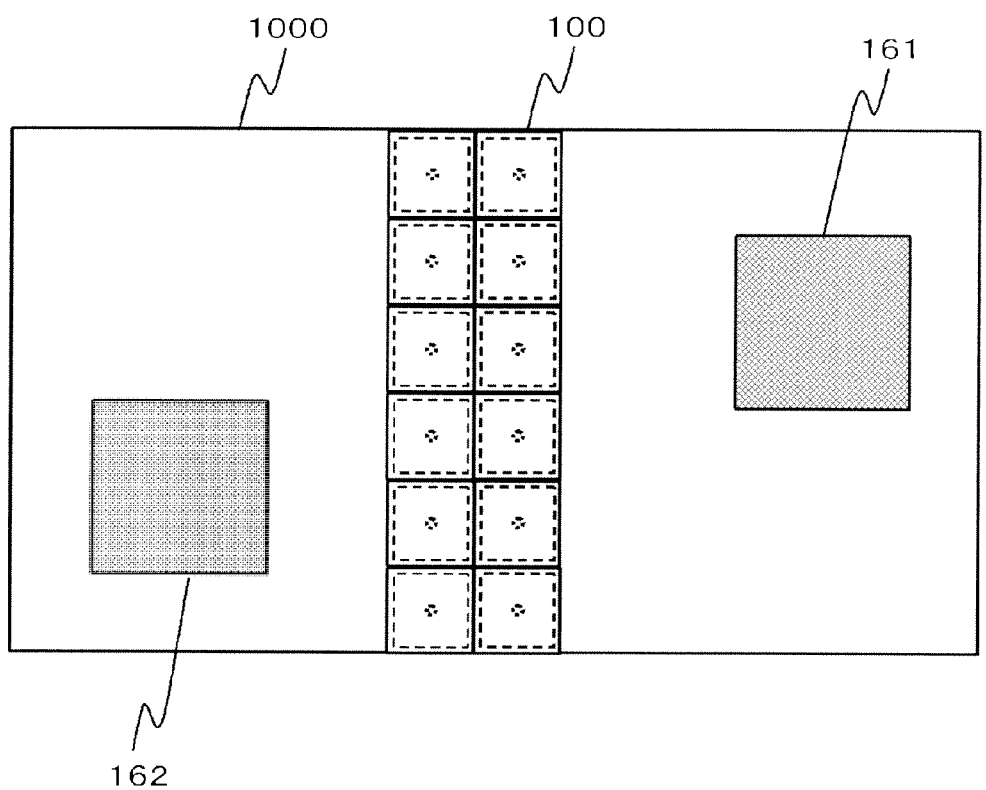
FIG. 4 is a diagram that illustrates an arrangement pattern of a structure that can be employed by a wiring board.
Figure 5:
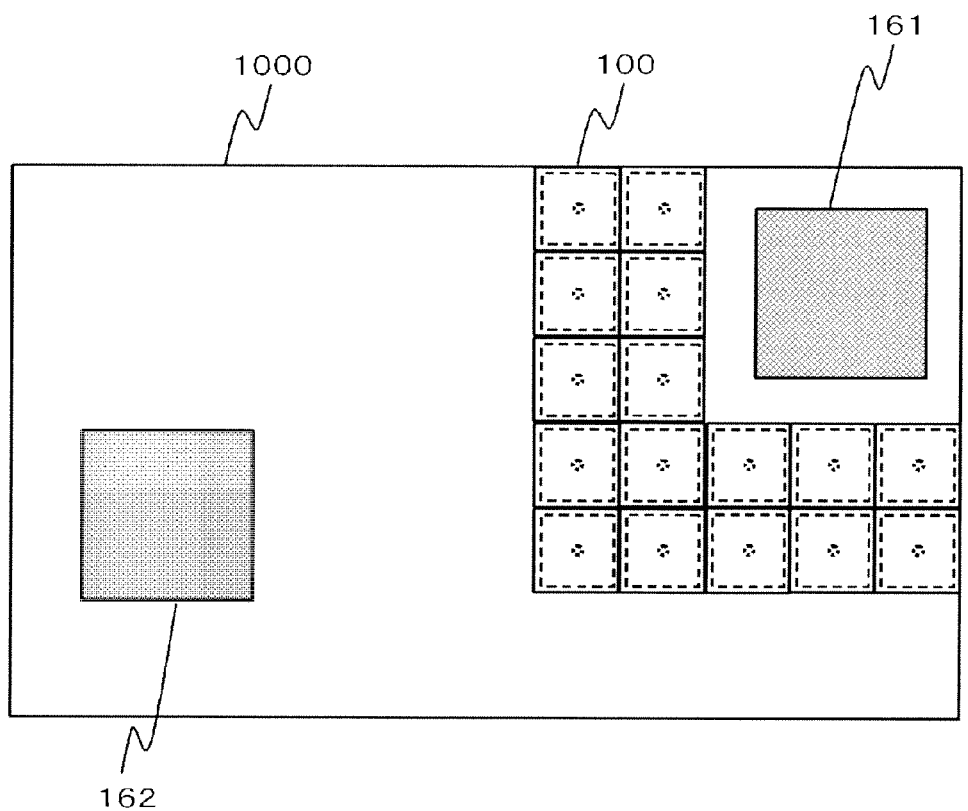
FIG. 5 is a diagram that illustrates an arrangement pattern of a structure that can be employed by a wiring board.
Figure 6:
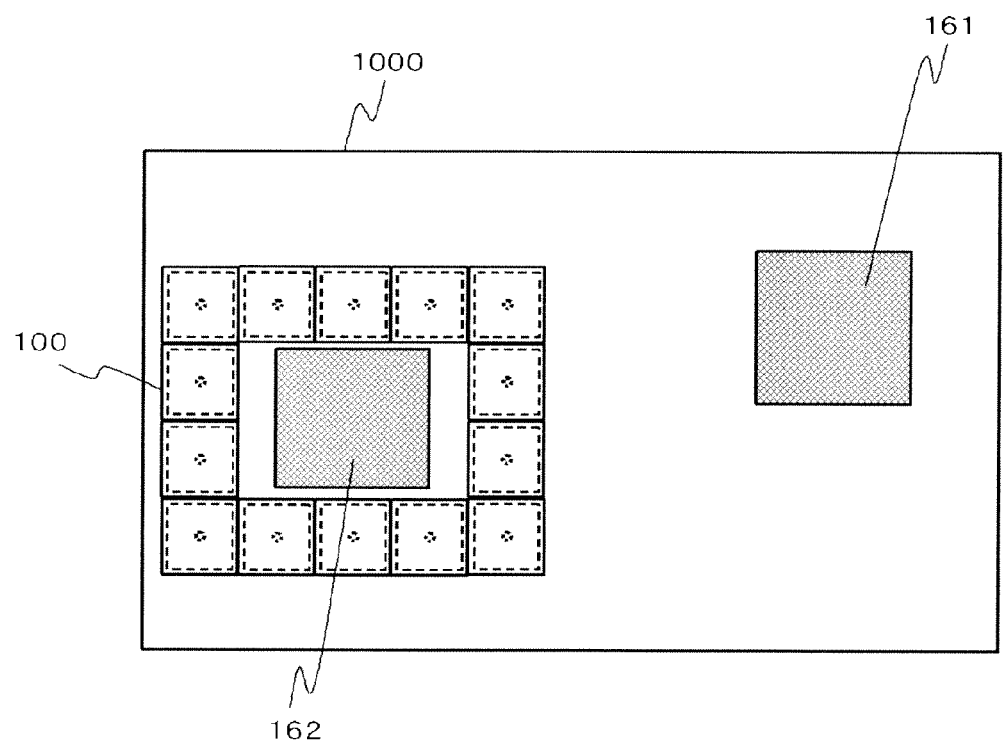
FIG. 6 is a diagram that illustrates an arrangement pattern of a structure that can be employed by a wiring board.

FIGS. 4 to 6 are diagrams that illustrate arrangement patterns of the structures 100 that can be employed by the wiring board 1000. Here, shaded members illustrated in FIGS. 4 to 6 are a semiconductor package 161 and a semiconductor package 162. As illustrated in FIG. 4, the structures 100 may be arranged in a band shape between the semiconductor package 161 and the semiconductor package 162. In addition, as illustrated in FIG. 5, the structures 100 may be arranged so as to surround the semiconductor package 161. In addition, as illustrated in FIG. 6, the structures 100 may be disposed so as to surround the semiconductor package 162.

However, by arranging the structures 100 such that electromagnetic waves to be suppressed pass through a plurality of structures 100 even in a case where the electromagnetic waves propagate in any direction, the propagation of the electromagnetic waves can be suppressed more effectively. Accordingly, like the arrangement patterns illustrated in FIG. 4 or 5, it is more preferable to arrange the plurality of structures 100 in a parallel manner in a direction from one semiconductor package to the other semiconductor package than to employ an arrangement pattern illustrated in FIG. 6.

In addition, by adjusting a gap between the ground conductive body 111 and the conductive element 121, a gap between the conductive element 121 and the conductive part 131, and a gap between the conductive part 131 and the ground conductive body 141, the thickness of the connection member 151, a mutual gap between the conductive elements 121, and the like, the frequency band that is a target for suppressing the propagation of electromagnetic waves can be set to a desired value.

Here, advantages of this embodiment will be described. Since each structure 100 included in the wiring board 1000 according to this embodiment has an EBG structure, an effect of suppressing electromagnetic waves of a relatively high frequency band can be acquired.

In addition, in the wiring board 1000 according to this embodiment, the connection member 151 is connected to the ground conductive body 111 and the ground conductive body 141. Since the connection members 151 that are arranged densely to some degree and are provided with the reference electric potential can decrease electromagnetic waves of a relatively low frequency band, the wiring board 1000 also has an effect of suppressing electromagnetic waves of a low frequency band.

In addition, in this embodiment, although the wiring board 1000 has been described in which a plurality of structures 100 is repeatedly arranged, even in a case where a single structure 100 is arranged therein, similarly to this embodiment, there is an effect of suppressing electromagnetic waves of both a relatively low frequency and a relatively high frequency depending on the sizes of the wiring board 1000 and the structure 100. However, the frequency band that is suppressed by the single structure 100 may be relatively limited, compared to a case where the plurality of structures 100 is arranged.

Furthermore, in this embodiment, the conductive element 121 is configured so as to be shared by both the EBG structure 171 and the EBG structure 172, and accordingly, the number of the B layers 120 in which the conductive elements 121 are configured and the number of the C layers 130 in which the conductive parts 131 are formed are the same. This effect will be described with reference to FIG. 7.

Figure 7:
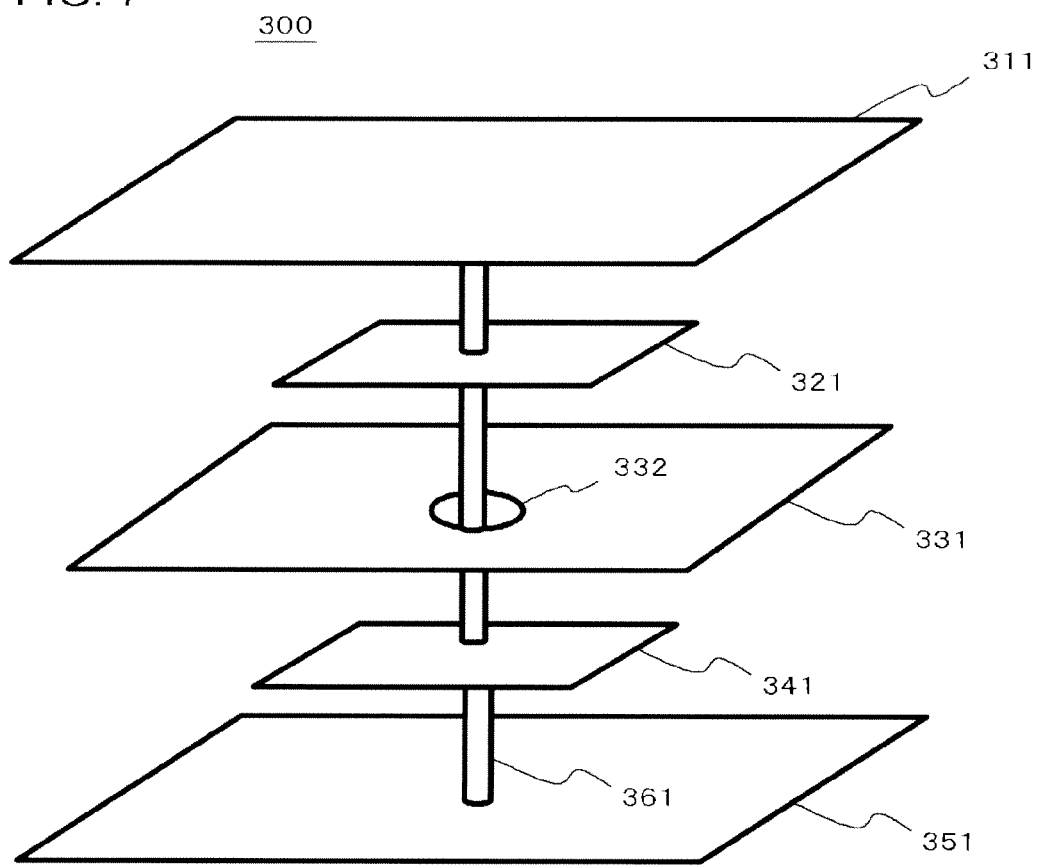
FIG. 7 is a perspective view of a modified example of the structure according to the first embodiment.

FIG. 7 is a perspective view of a structure 300 that is a modified example of the structure 100 according to this embodiment. In FIG. 7, a ground conductive body 311, a conductive part 331, an opening 332, a ground conductive body 351, and a connection member 361 correspond to the ground conductive body 111, the conductive part 131, the opening 132, the ground conductive body 141, and the connection member 151 respectively. A difference between the structure 100 and the structure 300 is that the number of layers in which conductive elements 321 and 341 are formed is greater than the number of layers in which the conductive parts 331 are formed. Since the structures 300 configure the EBG structures, by arranging the structures 300 densely to some degree, similarly to the structure 100, the propagation of electromagnetic waves in both the high frequency band and the low frequency band can be sufficiently suppressed. However, owing to the above-described difference, the structure 100 can be manufactured to be thinner than the structure 300.

Second Embodiment

Figure 8:
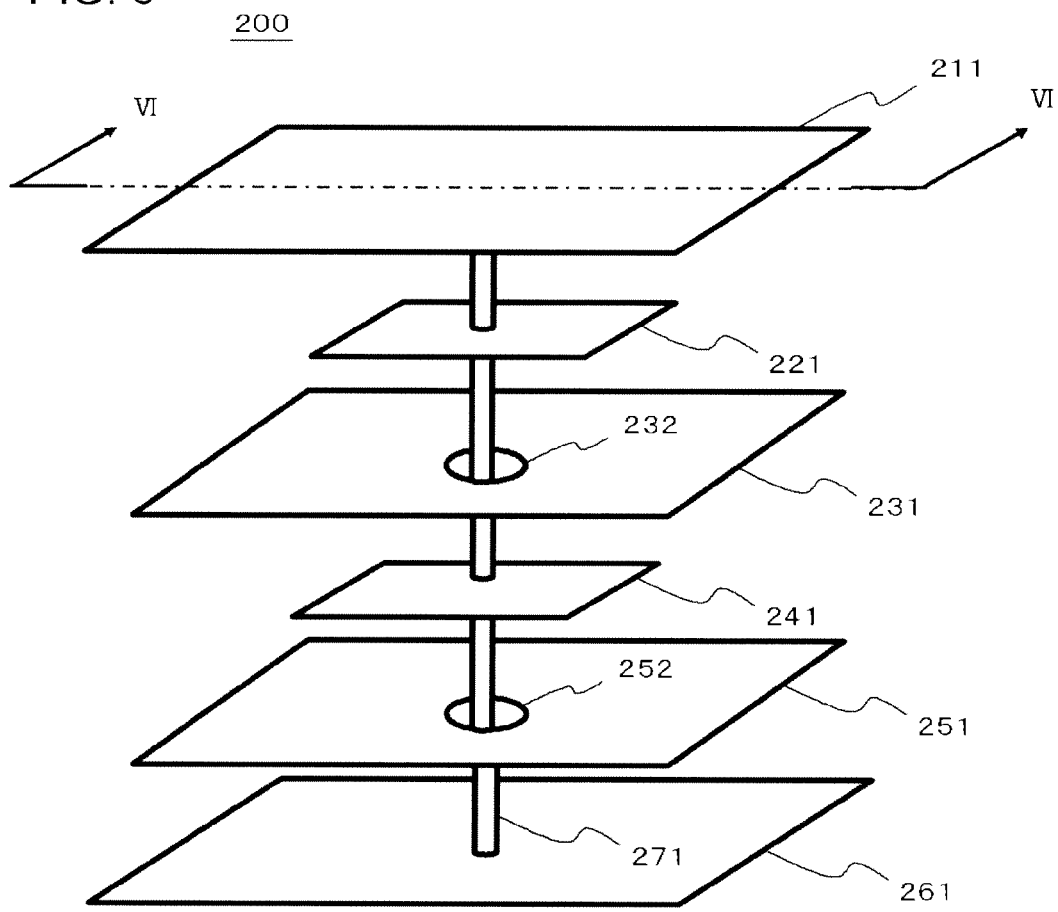
FIG. 8 is a perspective view of a structure according to a second embodiment of the present invention.

FIG. 8 is a perspective view of a structure 200 according to a second embodiment. The structure 200 is configured by various constituent elements having conductivity that are formed in an A layer 210, a B layer 220, a C layer 230, a D layer 240, an E layer 250, or an F layer 260. In addition, the A layer 210, the B layer 220, the C layer 230, the D layer 240, the E layer 250, or the F layer 260 is a layer of the wiring board 2000, and the layers face each other.

A ground conductive body 211 and a ground conductive body 261 are provided with a reference electric potential through grounding or the like. In addition, a ground conductive body 211 and a ground conductive body 261 are formed in the A layer 210 and the F layer 260 respectively and are connected in an interlayered manner through a connection member 271.

A conductive part 231 and a conductive part 251 are formed in the C layer 230 and the E layer 250 respectively. In addition, in the conductive part 231 and the conductive part 251, an opening 232 and an opening 252 through which the connection member 271 passes are arranged. The conductive part 231 and the conductive part 251 are not in contact with the connection member 271 but are insulated from each other.

The conductive element 221 and the conductive element 241 are formed in the B layer 220 and the D layer 240 respectively. In addition, the conductive element 221 faces the conductive part 231, and the conductive element 241 faces the conductive part 251, and the conductive elements 221 and 241 are electrically connected to the connection member 271 that passes through the opening 232 and the opening 252.

Figure 9:
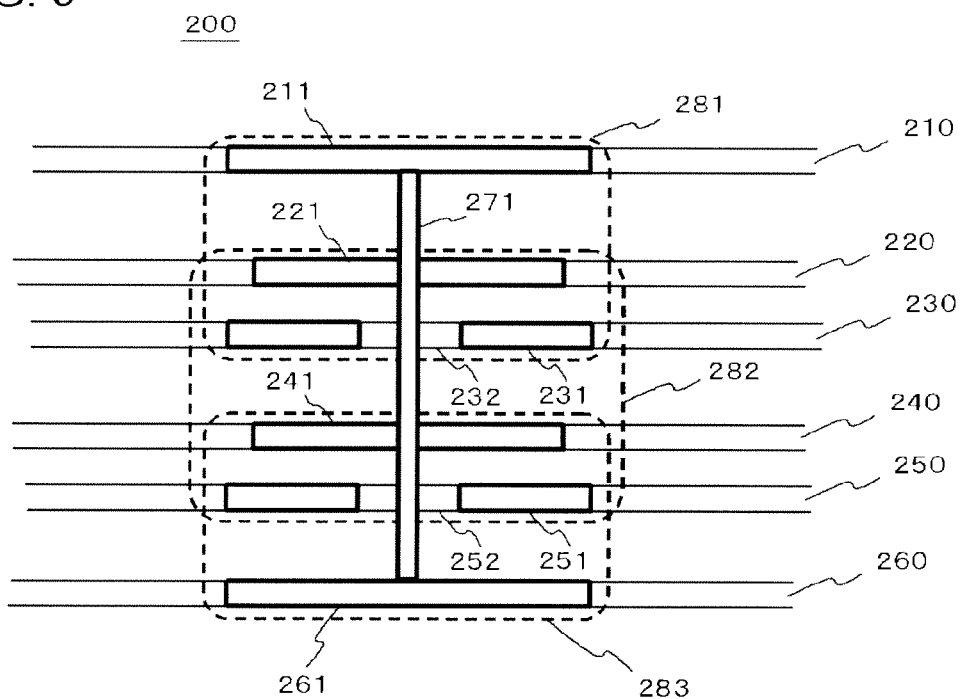
FIG. 9 is a cross-sectional view of the structure illustrated in FIG. 8.

FIG. 9 is a cross-sectional view in a cross-section illustrated in FIG. 8. In FIG. 9, spaces surrounded by broken lines form EBG structures and will be referred to as an EBG structure 281, an EBG structure 282, and an EBG structure 283. The EBG structure 281 is configured by the ground conductive body 211, the connection member 271, the conductive part 231 that is closest to the ground conductive body 211, and the conductive element 221 that is closest to the ground conductive body 211. In addition, the EBG structure 282 is configured by the conductive part 231, the conductive element 221, the connection member 271, the conductive part 251, and the conductive element 241. Furthermore, the EBG structure 283 is configured by the ground conductive body 261, the connection member 271, the conductive part 251 that is closest to the ground conductive body 261, and the conductive element 241 that is closest to the ground conductive body 261.

In other words, the single structure 200 configures the EBG structure 281, the EBG structure 282, and the EBG structure 283. In addition, the conductive element 221 is shared by both the EBG structure 281 and the EBG structure 282. Furthermore, the conductive element 241 is shared by both the EBG structure 282 and the EBG structure 283. Accordingly, compared to a case where two EBG structures are arranged, miniaturization can be further achieved.

As described above, according to the structure 200 of this embodiment in which the conductive part 231 and the conductive part 251 are respectively formed in a plurality of layers (the C layer 230 and the E layer 250), it can be understood that the EBG structure is configured more complicatedly than that of a case where the number of the layer (C layer 130) in which a single conductive part 131 is formed as in the first embodiment.

Figure 10:
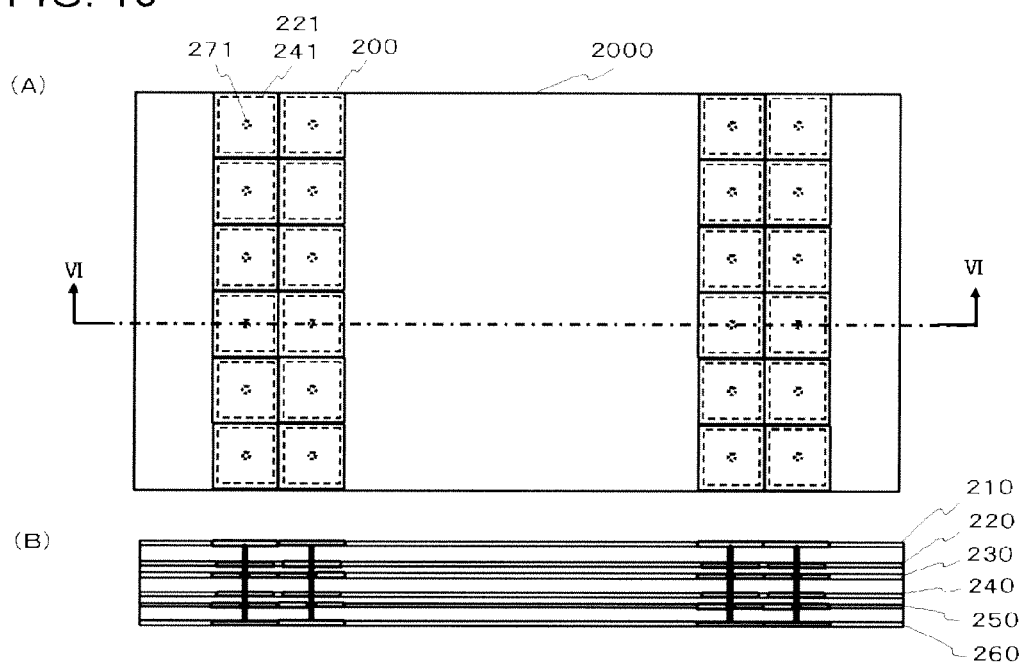
FIG. 10 represents a top view and a cross-sectional view of a wiring board according to a second embodiment.

FIG. 10 represents a top view and a cross-sectional view of the wiring board 2000 according to this embodiment. More specifically, FIG. 10(A) is a top view of the wiring board 2000, and FIG. 10(B) is a cross-sectional view in the cross-section illustrated in FIG. 10(A). In FIG. 10(A), each quadrangle that is denoted by broken lines represents the conductive element 221 or the conductive element 241 that is included in one of the repeatedly arranged structures 200. In addition, in FIG. 10(A), each circuit that is denoted by a broken line represents the connection member 271 that is included in each one of the repeatedly arranged structures 200.

In the A layer 210, a ground plane that includes a plurality of conductive bodies 211 is formed. In the F layer 260, a ground plane that includes a plurality of conductive bodies 261 is formed. The ground plane is a so-called beta conductor and is provided with a reference electric potential through grounding or the like. In addition, the ground plane may be divided into a plurality of parts.

In the B layer 220, a plurality of the conductive elements 221 is formed in island shapes while being separated from each other, and, in the D layer 240, a plurality of the conductive elements 241 is formed in island shapes while being separated from each other. Each conductive element 221 or conductive element 241 is connected to the ground plane and the ground plane through the connection member 271.

In the C layer 230, a conductive plane that includes a plurality of conductive parts 231 is formed. The conductive element 221 faces each conductive part 231. In addition, in the conductive part 231, an opening 232 through which the connection member 271 connected to the facing conductive element 221 passes is arranged. In the E layer 250, a conductive plan that includes a plurality of the conductive parts 251 is formed. The conductive element 241 faces each conductive part 251. In addition, in the conductive part 251, an opening 252 through which the connection member 271 connected to the facing conductive element 241 passes is formed. The above-described conductive plane is a so-called a beta conductor and, for example, may be a power source plane that supplies power. In such a case, the conductive plane is provided with a constant electric potential. In addition, the conductive plane may be divided into a plurality of parts.

Each one of the A layer 210, the B layer 220, the C layer 230, the D layer 240, the E layer 250, and the F layer 260 may include a configuration other than the above-described constituent elements, for example, a transmission path that transmits an electrical signal or the like. In addition, the wiring board 2000 may include a layer other than the A layer 210, the B layer 220, the C layer 230, the D layer 240, the E layer 250, and the F layer 260, and, in the layer, a configuration other than the above-described constituent elements, for example, a transmission path or the like may be included. However, in a case where the transmission path is arranged in an area in which the structures 200 are repeatedly arranged in the wiring board 2000 or near the area, the characteristics of the EBG structure that forms the structure 200 change, and accordingly, it is preferable to avoid such an arrangement.

Here, advantages of this embodiment will be described. Since each structure 200 included in the wiring board 2000 according to this embodiment has an EBG structure, an effect of suppressing electromagnetic waves of a relatively high frequency band can be acquired.

In addition, in the wiring board 2000 of this embodiment, the repeatedly arranged connection members 271 are connected to the ground conductive body 211 and the ground conductive body 261. Since the connection members 271 that are arranged densely to some degree and are provided with the reference electric potential can decrease electromagnetic waves of a relatively low frequency band, the wiring board 2000 also has an effect of suppressing electromagnetic waves of a low frequency band.

In other words, according to the wiring board 2000 of this embodiment, similarly to the wiring board 1000 according to the first embodiment, there is an effect of sufficiently suppressing electromagnetic waves of both a relatively low frequency band and a relatively high frequency band.

As above, although the present invention has been described in detail using the embodiments, the present invention is not limited to the contents thereof, and any modification or change can be made therein in a range not departing from the scope of the present invention.

Figure 11:
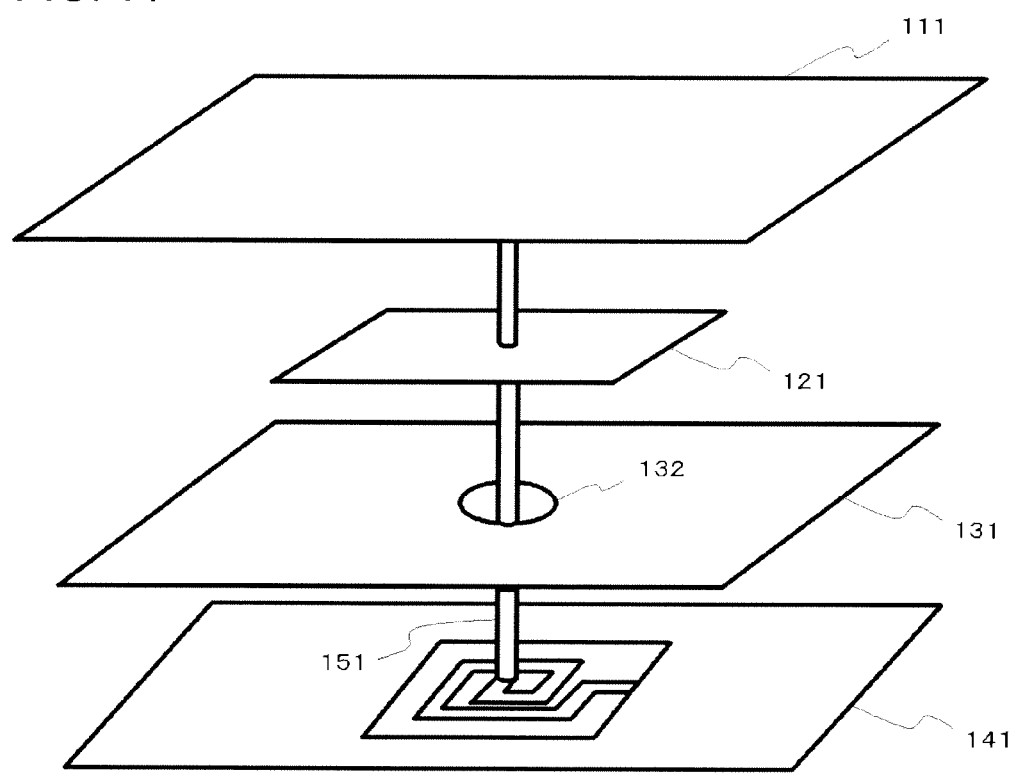
FIG. 11 is a perspective view of a modified example of the structure described in the first embodiment.
Figure 12:
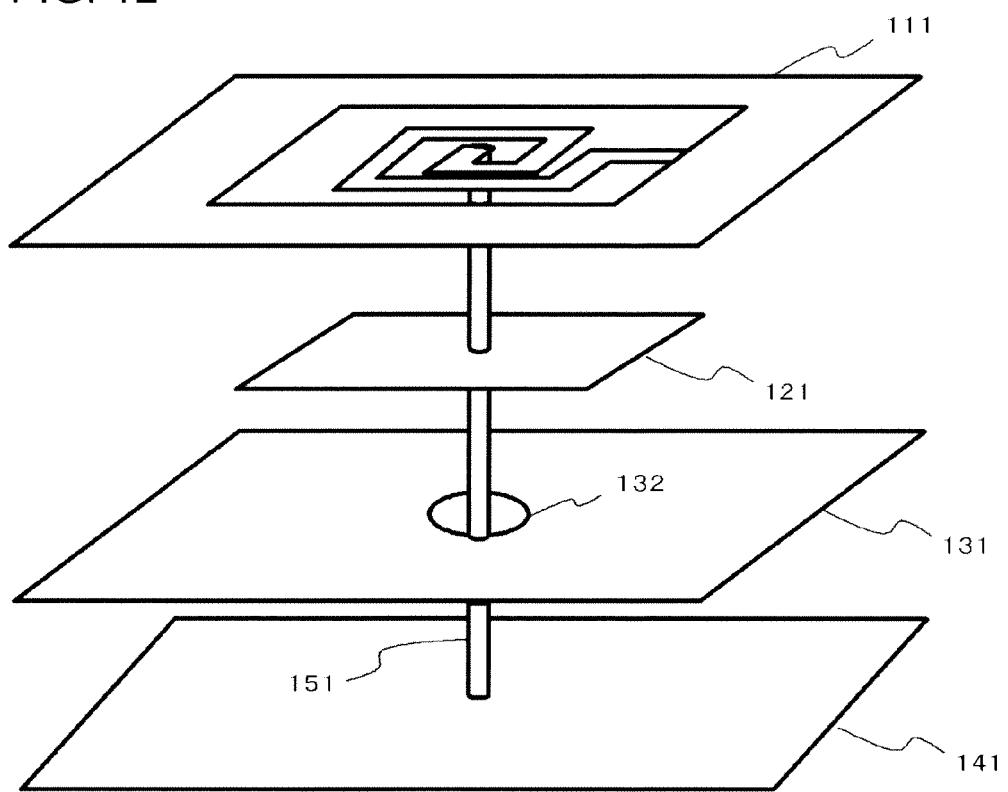
FIG. 12 is a perspective view of a modified example of the structure described in the first embodiment.
Figure 13:
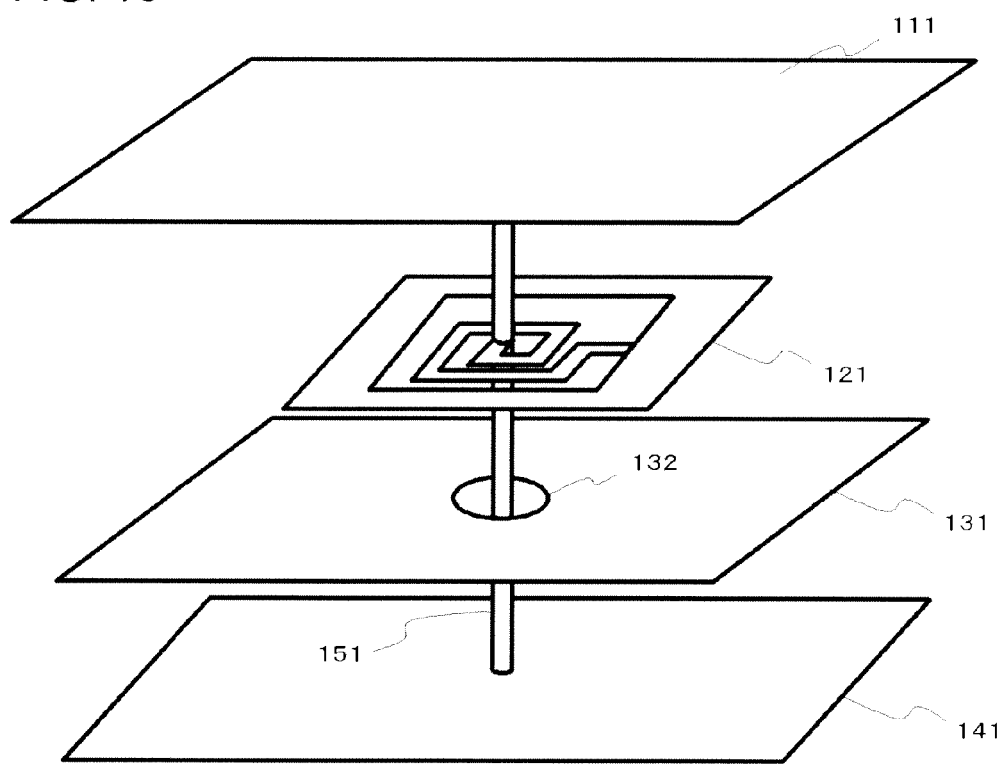
FIG. 13 is a perspective view of the modified example of the structure described in the first embodiment.

For example, FIGS. 11 to 14 are perspective views of modified examples of the structure 100 that has been described in the first embodiment. As illustrated in FIGS. 11 to 13, the ground conductive body 111, the conductive element 121, or the ground conductive body 141 may be a flat plate in which an opening is disposed at the center, and include a spiral-shaped conductive body pattern in the opening. At this time, it may be configured such that one end of the spiral-shaped conductive body pattern is connected to flat plate, and the other end is connected to the connection member 151. In addition, the spiral pattern may not be necessarily to be in a spiral shape but, for example, may be in a linear shape, a curved shape, a meandering shape, or the like.

Figure 14:
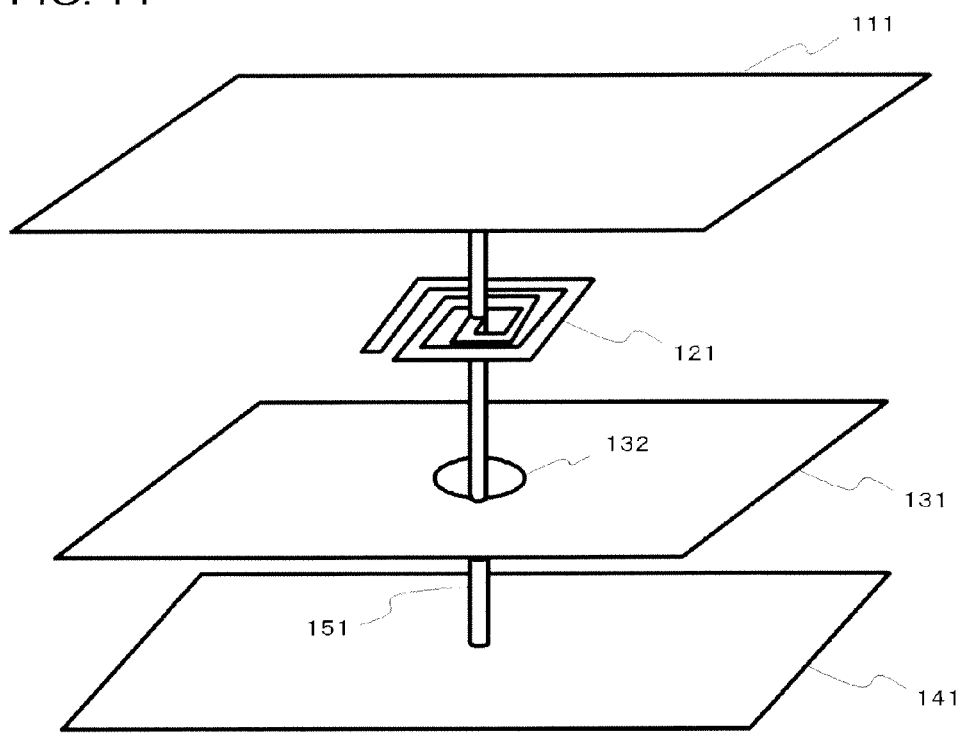
FIG. 14 is a perspective view of a modified example of the structure described in the first embodiment.

In addition, the structure illustrated in FIG. 14 is an open-stub type EBG structure in which a microstrip line that is formed so as to include the conductive element 121 serves as an open stub. More specifically, the connection member 151 forms inductance. In addition, the conductive element 121 forms a microstrip line with the conductive part 131 configured as a return path by being electrically coupled with the facing conductive part 131. One end of the above-described micro-strip line becomes an open end and is configured so as to serve as an open stub. In addition, although the conductive element 121 has a spiral-shaped pattern in the open-stub type of the EBG structure illustrated in FIG. 14, the pattern of the conductive element 121 is not limited thereto but may be a linear-shaped pattern, a curved shape pattern, a meandering-shaped pattern, or the like.

The open-stub type EBG structure can be represented as an equivalent circuit in which parallel flat plates formed from the ground conductive body 111 and the conductive part 131 or parallel flat plates formed from the ground conductive body 141 and the conductive part 131 are shunt by a serial resonance circuit that is formed by the above-described open stub and the above-described inductance, and the resonant frequency of the above-described serial resonant circuit represents the center frequency of the band gap. Accordingly, by increasing the stub length of the open stub that is formed so as to include the above-described conductive element 121, the frequency of the band gap band can decrease. Although the open-stub type EBG structure needs a stub length for decreasing the frequency of the band gap, an area is not necessarily required, and accordingly, the miniaturization of the conductive element 121 can be achieved.

In addition, it is preferable that the conductive element 121 and the opposed conductive part 131 that form the microstrip line be close to each other. The reason for this is that the characteristic impedance of the microstrip line decreases as a distance between the conductive element and the conductive part is shortened, and accordingly, the band gap band can be configured as a broad band. However even in a case where the above-described conductive element 121 is not formed to be close to the opposed conductive part 131, the essential effect of the present invention is not influenced at all.

As described above, as a modified example of the structure 200 described in the second embodiment, the ground conductive body 211, the conductive element 221, the conductive element 241, or the ground conductive body 261 may be a flat plate in which an opening is disposed at the center, and include a spiral-shaped conductive body pattern in the opening. At this time, it may be configured such that one end of the spiral-shaped conductive body pattern is connected to the flat plate, and the other end is connected to the connection member 271. In addition, it may be configured such that the conductive element 221 or the conductive element 241 is a spiral-shaped conductive body pattern, and one end thereof is connected to the connection member 271. By employing such a structure, the inductance of the constituent element having a spiral-shaped conductive body pattern increases, and accordingly, the miniaturization of the structure 200 can be achieved.

In the first embodiment, although only a case has been described in which the conductive element 121 is located on the ground conductive body 111 side with respect to the conductive part 131, the present invention is not limited thereto. FIG. 15 is a diagram that illustrates a modified example of the arrangement of the structure 100 described in the first embodiment. As illustrated in FIG. 15, a part of the conductive element 121 may be located on the ground conductive body 141 side with respect to the conductive part 131. In addition, as illustrated in FIG. 15, in a case where the conductive element 121 located on the ground conductive body 111 side and the conductive element 121 located on the ground conductive body 141 side are alternately arranged, the number of repetitions of the arrangement of the conductive element 121 can be greater than that of the first embodiment. Accordingly, a high-density EBG structure can be provided. Accordingly, an EBG structure having characteristics that is improved more than those of the first embodiment can be configured.

In addition, as a modified example of the structure 200 described in the second embodiment, one of the B layer 220 in which the conductive element 221 is formed, and the D layer 240 in which the conductive element 241 is formed may not be present. In other words, the number of layers in which the conductive element (fourth conductive body) may be less than the number of layers in which the conductive part (third conductive body) is formed.

In FIG. 9, although the conductive element 221 is formed in a middle layer between the ground conductive body 211 and the conductive part 231, the conductive element 221 may be formed in a middle layer of the conductive part 231 and the conductive part 251. In addition, in FIG. 9, although the conductive element 241 is formed in a middle layer between the conductive part 231 and the conductive part 251, the conductive element 241 may be formed in a middle layer between the conductive part 251 and the ground conductive body 261.

Although the conductive element is connected to the connection member 151 or the connection member 271 illustrated in the above-described embodiment, the present invention is not limited thereto, and there may be a part of the connection member 151 or the connection member 271 that is not connected to the conductive element. It is apparent that in a case where the EBG structure collapses in accordance with no connection with the conductive element, the effect of suppressing electromagnetic waves of a high frequency band in a space located nearby decreases.

EXAMPLES

Hereinafter, although the present invention will be described with reference to examples, the present invention is not limited only to the examples of the present invention.

Example 1

Figure 16:
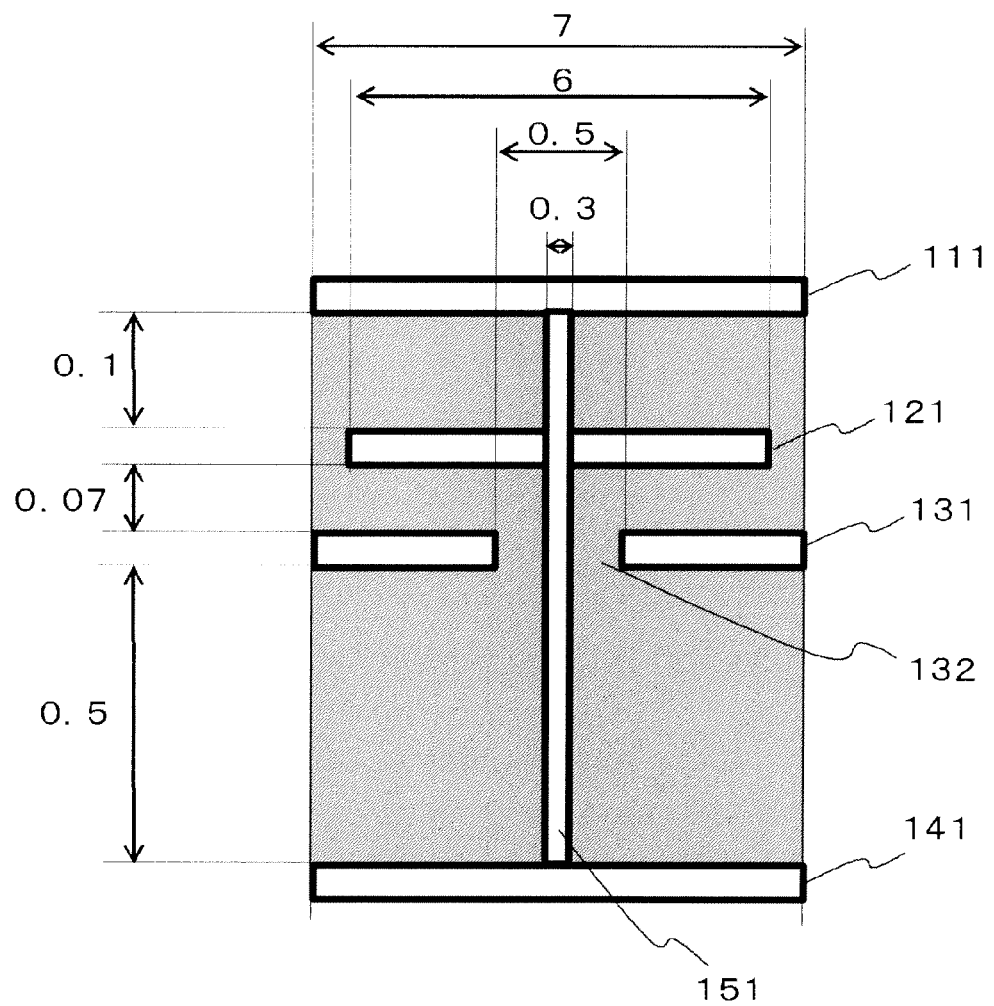
FIG. 16 is a diagram that illustrates the dimensions of a structure that is used in a simulation.

FIG. 16 is a diagram that illustrates the dimensions of a structure 100 that is used in a simulation. A ground conductive body 111 and a ground conductive body 141 have a square shape having a one-side length of 7 mm. In addition, a conductive part 131 has a square shape having a one-side length of 7 mm as well, and an opening 132 having a diameter of 0.5 mm is disposed at the center thereof. In addition, the conductive element 121 has a square shape having a one-side length of 6 mm, and the diameter of the connection member 151 is 0.3 mm. Furthermore, a gap between the ground conductive body 111 and the conductive element 121, a gap between the conductive element 121 and the conductive part 131, and a gap between the conductive part 131 and the ground conductive body 141 are 0.1 mm, 0.07 mm, and 0.5 mm respectively. A ground conductive body 111, a conductive element 121, a conductive part 131, a ground conductive body 141, and a connection member 151 are incomplete conductive bodies. In addition, the thicknesses of the conductive element 121, the conductive part 131, and the ground conductive body 141 are ignored. Furthermore, a diagonally-lined portion other than the above-described various conductive members is an inductor, the dielectric constant=4.2, and Tan δ=0.025.

FIG. 17 represents a top view and a cross-sectional view of a wiring board 3000 that is used in the simulation. More specifically, FIG. 17(A) is a top view of the wiring board 3000 in which the structures 100 illustrated in FIG. 16 are repeatedly arranged and illustrates that the structures 100 are arranged by 10×10. In addition, the structures 100 are electrically connected without being separated from each other, and the wiring board 3000 forms a square having a one-side length of 70 mm in the plan view. In addition, FIG. 17(B) is a cross-sectional view of the wiring board 3000 and is a cross-sectional view in the cross-section shown in FIG. 17(A). Here, in an area in which the conductive part 131 and the ground conductive body 141 face each other, places spaced apart from the corners of the wiring board 3000 by 14 mm are set as a port 181 and a port 182. In addition, in an area in which the ground conductive body 111 and the conductive part 131 face each other, places spaced apart from the corners of the wiring board 3000 by 14 mm are set as a port 183 and a port 184.

In this embodiment, electricity is delivered from the port 181, and the amount of attenuation of electromagnetic waves received by the port 182 is simulated. In addition, electricity is delivered from the port 183, and the amount of attenuation of electromagnetic waves received by the port 184 is simulated.

Figure 18:
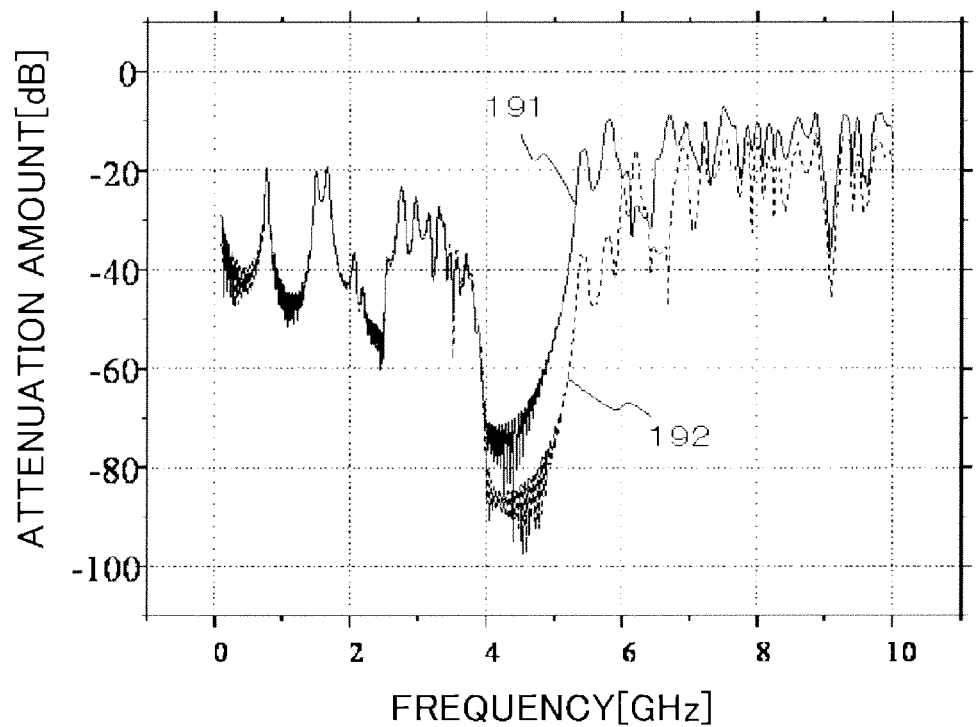
FIG. 18 is a graph that illustrates a simulation result of an upper end portion and a lower end portion of the wiring board.

FIG. 18 is a graph that illustrates simulation results of an upper end portion (the port 183 or the port 184) and a lower end portion (the port 181 and the port 182) of the wiring board 3000 used in this example. In this graph, the vertical axis represents the amount of attenuation of electromagnetic waves, and the unit is dB (decibels). In the graph, the horizontal axis represents the frequency, and the unit is GHz (Giga hertz). Furthermore, a curve 191 illustrates a simulated value in the lower end portion. A curve 192 represents a simulated value in the upper end portion. In addition, since the simulated value in the port 181 and the simulated value in the port 182 are the same, the simulated value can be represented by one curve 191. Similarly, since the simulated value in the port 183 and the simulated value in the port 184 are the same, the simulated value can be represented by one curve 192.

From the simulation results represented in FIG. 18, both the upper end portion and the lower end portion of the wiring board 3000 represent a band gap region including 400 MHz, a band gap region including 1.2 GHz, a band gap region including 2.4 GHz, and a band gap region including 4.4 GHz, and it can be understood that a sufficient suppression effect (an attenuation amount of 40 dB or more) is acquired in any band gap region.

The frequency band near 2.4 GHz is mainly used for a wireless LAN or wireless Internet technologies. In addition, the frequency band near 400 MHz is used mainly for radio devices for a public use. The wiring board 3000 of this example has a sufficient suppression effect for electromagnetic waves of both the frequency bands.

Comparative Example 1

Figure 19:
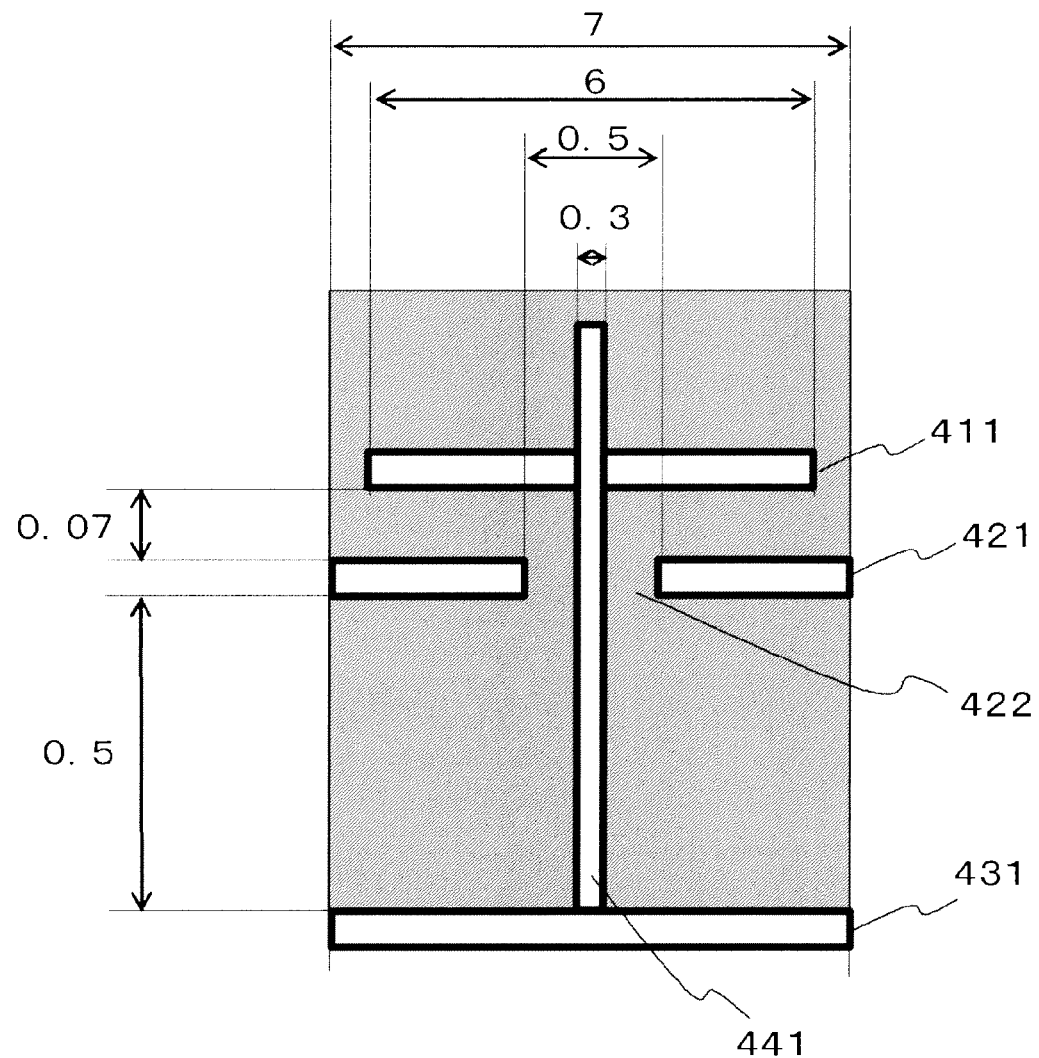
FIG. 19 is a diagram that illustrates the dimensions of a structure that is used in a simulation.

FIG. 19 is a diagram that illustrates the dimensions of a structure 400 that is used in a simulation. The structure 400 is a conventional type EBG structure having a so-called mushroom structure. A conductive body pattern 411 is a square having a one-side length of 6 mm, and a conductive body pattern 431 is a square having a one-side length of 7 mm. In addition, a conductive body pattern 421 is a square having a one-side length of 7 mm, and an opening 422 having a diameter of 0.5 mm is formed at the center thereof. The diameter of a connection member 441 is 0.3 mm. In addition, a gap between the conductive body pattern 411 and the conductive body pattern 421 and a gap between the conductive body pattern 421 and the conductive body pattern 431 are 0.07 mm and 0.5 mm respectively. The conductive body pattern 411, the conductive body pattern 421, the conductive body pattern 431, and the connection member 441 are complete conductive bodies. In addition, the thicknesses of the conductive body pattern 411, the conductive body pattern 421, and the conductive body pattern 431 are ignored. Furthermore, a diagonally-lined portion other than the above-described various conductive members is an inductor, the dielectric constant=4.2, and Tan δ=0.025.

FIG. 20 represents a top view and a cross-sectional view of a wiring board 4000 that is used in the simulation. More specifically, FIG. 20(A) is a top view of the wiring board 4000 in which the structures 400 illustrated in FIG. 19 are repeatedly arranged and illustrates that the structures 400 are arranged by 10×10. In addition, the structures 400 are electrically connected without being separated from each other, and the wiring board 4000 forms a square having a one-side length of 70 mm in the plan view. In addition, FIG. 20(B) is a cross-sectional view of the wiring board 4000 and is a cross-sectional view in the cross-section shown in FIG. 20(A). Here, in an area in which the conductive body pattern 421 and the conductive body pattern 431 face each other, places spaced apart from the corners of the wiring board 4000 by 14 mm are set as a port 481 and a port 482. The amount of attenuation of electromagnetic waves is simulated in the port 481 and the port 482.

In this comparative example, electricity is supplied from the port 481, and the amount of attenuation of electromagnetic waves received by the port 482 is simulated.

Figure 21:
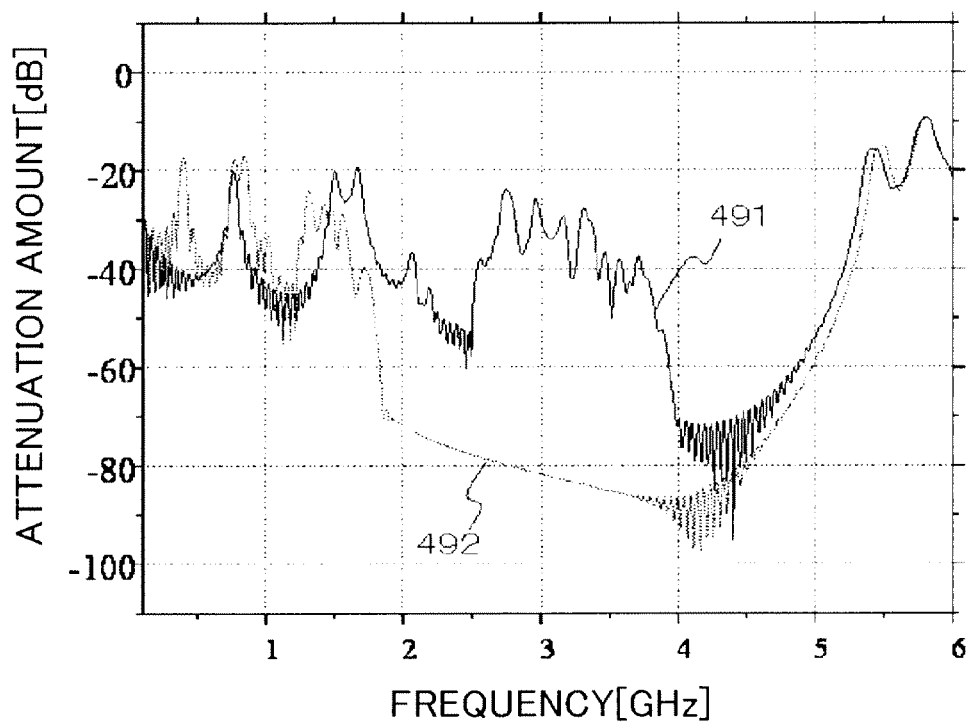
FIG. 21 is a graph that illustrates a simulation result of the wiring board.

FIG. 21 is a graph that illustrates simulation results of the wiring board 3000 and the wiring board 4000. In this graph, the vertical axis represents the amount of attenuation of electromagnetic waves, and the unit is dB (decibels). In addition, in the graph, the horizontal axis represents the frequency, and the unit is GHz (Giga hertz). In addition, a curve 491 illustrates a simulated value in the port 181 or the port 182 shown in FIG. 17 and is the same as a part (0 Hz to 6 GHz) of the curve 191. A curve 492 represents a simulated value in the port 481 or the port 482. In addition, since the simulated value in the port 481 and the simulated value in the port 482 are the same, the simulated value can be represented by one curve 492.

From the simulation results represented in FIG. 21, it can be understood that although the wiring board 4000 has a suppression effect that is higher than that of the wiring board 3000 in the band gap region including 2.4 GHz, a sufficient suppression effect cannot be acquired in the frequency band near 400 MHz.

The invention claimed is:

1. A structure comprising:
a first conductive body and a second conductive body that are respectively formed in a first layer and a second layer that face each other;
a connection member that connects the first conductive body and the second conductive body;
a third conductive body that is formed in a third layer that is located in the middle of the first layer and the second layer and faces the first conductive body and the second conductive body;
an opening, through which the connection member passes, disposed in the third conductive body; and
a fourth conductive body that is located in a fourth layer that is located in the middle of the first layer and the second layer and is different from the third layer, faces the third conductive body, and is electrically connected to the connection member that passes through the opening disposed in the third conductive body,
wherein the structure and another structure comprised in the same way as the structure are arranged in a parallel manner, and
the first conductive body of the structure and the first conductive body of the another structure are connected with each other,
wherein the second conductive body of the structure and the second conductive body of the another structure are in physical contact with each other.

2. The structure according to claim 1,
wherein the first conductive body and the second conductive body are provided with a reference electric potential.

3. The structure according to claim 1,
wherein the number of the fourth layers in which the fourth conductive body is formed is equal to or less than the number of the third layers in which the third conductive body is formed.

4. The structure according to claim 1,
wherein the number of the third layer in which the third conductive body is formed is one, and
wherein a first electromagnetic band gap structure that includes at least the first conductive body and the third conductive body is configured, and a second electromagnetic band gap structure that includes at least the second conductive body and the third conductive body is configured.

5. The structure according to claim 4,
wherein the first electromagnetic band gap structure is configured by the first conductive body, the connection member, the third conductive body, and the fourth conductive body, and
wherein the second electromagnetic band gap structure is configured by the second conductive body, the connection member, the third conductive body, and the fourth conductive body.

6. The structure according claim 1,
wherein the number of the third layers in which the third conductive body is formed is two or more, and
wherein a third electromagnetic band gap structure that includes at least the first conductive body and the third conductive body that is closest to the first conductive body is configured, and a fourth electromagnetic band gap structure that includes at least a plurality of the third conductive bodies is configured.

7. The structure according to claim 6,
wherein the third electromagnetic band gap structure is configured by the first conductive body, the connection member, one third conductive body that is closest to the first conductive body out of the third conductive bodies, and one fourth conductive body that is closest to the first conductive body out of the fourth conductive bodies, and
wherein the one third conductive body, the one fourth conductive body, and the connection member configure the fourth electromagnetic band gap structure together with other third conductive bodies and other fourth conductive bodies.

8. The structure according to claim 1,
wherein at least one of the first conductive body, the second conductive body and the fourth conductive body has a conductive body pattern in a spiral shape, a linear shape, a curved shape or a meandering shape, and one end of the conductive body pattern is connected to the connection member,
wherein the other end of the conductive body pattern is an open end.

9. The structure according to claim 1, wherein the first conductive body and the fourth conductive body are separated from each other.

10. The structure according to claim 1, wherein the second conductive body of the structure and the second conductive body of the another structure are in direct contact with each other.

11. A wiring board including a plurality of structures,
each of the structures comprising:
a first conductive body and a second conductive body that are respectively formed in a first layer and a second layer that face each other;
a connection member that connects the first conductive body and the second conductive body;
a third conductive body that is formed in a third layer that is located in the middle of the first layer and the second layer and faces the first conductive body and the second conductive body;
an opening, through which the connection member passes, disposed in the third conductive body;
a fourth conductive body that is located in a fourth layer that is located in the middle of the first layer and the second layer and is different from the third layer, faces the third conductive body, and is electrically connected to the connection member that passes through the opening disposed in the third conductive body,
wherein the structures are arranged in a parallel manner, and
the first conductive body of the first structure and the first conductive body of the second structure are connected with each other,
wherein the second conductive body of the first structure and the second conductive body of the second structure are in physical contact with each other.

12. A method of manufacturing a wiring board, the method comprising:
arranging a plurality of structures, each of the structures comprising a first conductive body, a second conductive body, a third conductive body, a fourth conductive body and a connection member, by the following steps (a) and (b),
(a) arranging the first conductive body in a first layer, the second conductive body in a second layer, the third conductive body in a third layer that is located in the middle of the first layer and the second layer, and the fourth conductive body in a fourth layer that is located in the middle of the first layer and the second layer and is different from the third layer, and arranging the first conductive body and the second conductive body to face each other and the third conductive body and the fourth conductive body to face each other; and
(b) arranging a through hole that passes through the first conductive body, the second conductive body, the third conductive body, and the fourth conductive body and forming the connection member that is insulated from the third conductive body and is connected to the first conductive body, the second conductive body, and the fourth conductive body inside the through hole,
wherein the first conductive body of the first structure and the first conductive body of the second structure are connected with each other,
wherein the second conductive body of the first structure and the second conductive body of the second structure are in physical contact with each other.

* * * * *